(12) United States Patent
Kaneyoshi et al.

(10) Patent No.: US 9,598,636 B2
(45) Date of Patent: Mar. 21, 2017

(54) PHOSPHOR SURFACE TREATMENT METHOD

(71) Applicant: SHIN-ETSU CHEMICAL CO., LTD., Tokyo (JP)

(72) Inventors: Masami Kaneyoshi, Echizen (JP); Masatoshi Ishii, Echizen (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 14/358,247

(22) PCT Filed: Dec. 20, 2013

(86) PCT No.: PCT/JP2013/084252
§ 371 (c)(1),
(2) Date: May 15, 2014

(87) PCT Pub. No.: WO2014/013932
PCT Pub. Date: Jul. 3, 2014

(65) Prior Publication Data
US 2015/0329770 A1    Nov. 19, 2015

(30) Foreign Application Priority Data

Dec. 28, 2012  (JP) ................... 2012-287321

(51) Int. Cl.
C09K 11/61    (2006.01)
C09K 11/02    (2006.01)
B05D 1/18     (2006.01)
H01L 33/50    (2010.01)

(52) U.S. Cl.
CPC .............. C09K 11/025 (2013.01); B05D 1/18 (2013.01); C09K 11/617 (2013.01); H01L 33/502 (2013.01)

(58) Field of Classification Search
CPC ... C09K 11/617; C09K 11/675; C09K 11/616; C09K 11/628; C09K 11/645; C09K 11/665; C09K 11/02; C09K 11/025; C09K 11/0833; C09K 11/0838; C09K 11/57; C09K 11/664; C01P 2004/61; Y02B 20/181; C01B 9/08; Y10T 428/2991; C04B 2235/445
USPC ..... 252/301.4 H, 301.4 F, 301.4 R; 428/403; 423/464
See application file for complete search history.

(56) References Cited

U.S. PATENT DOCUMENTS

| | | | | | |
|---|---|---|---|---|---|
| 3,304,318 A | * | 2/1967 | Brady | ................. | C07F 7/0834 502/168 |
| 4,079,084 A | * | 3/1978 | Houghton | ............ | C08G 65/326 106/3 |
| 4,689,172 A | * | 8/1987 | Czeiler | ................. | H01J 9/225 252/301.36 |
| 6,020,067 A | * | 2/2000 | Iwama | ................ | C09K 11/025 428/403 |
| 7,497,973 B2 | * | 3/2009 | Radkov | ................ | C09K 11/617 252/301.4 F |
| 7,648,649 B2 | | 1/2010 | Radkov et al. | | |
| 8,057,706 B1 | * | 11/2011 | Setlur | ................... | C09K 11/02 252/301.4 F |
| 8,427,042 B2 | | 4/2013 | Hata et al. | | |
| 8,491,816 B2 | * | 7/2013 | Hong | ................... | C09K 11/616 252/301.4 H |
| 2002/0158216 A1 | * | 10/2002 | Neriishi | ................ | G03B 42/08 250/584 |
| 2010/0090585 A1 | * | 4/2010 | Seto | ....................... | C04B 35/16 313/503 |
| 2011/0147664 A1 | * | 6/2011 | Lyons | ..................... | H01J 29/20 252/301.36 |
| 2012/0256125 A1 | | 10/2012 | Kaneyoshi et al. | | |

FOREIGN PATENT DOCUMENTS

| | | | | |
|---|---|---|---|---|
| JP | 2006077234 A | * | 3/2006 | |
| JP | 2008-050548 A | | 3/2008 | |
| JP | 2009-528429 A | | 8/2009 | |
| JP | 2009-270091 A | | 11/2009 | |
| JP | 2009-280763 A | | 12/2009 | |
| JP | 2010-045328 A | | 2/2010 | |
| JP | 2010-251621 A | | 11/2010 | |
| JP | 2011-068789 A | | 4/2011 | |
| JP | 2012-117029 A | | 6/2012 | |
| JP | 2012-224536 A | | 11/2012 | |
| WO | WO 2009099211 A1 | * | 8/2009 | ........... C09K 11/616 |
| WO | WO 2011/073951 A2 | | 6/2011 | |

OTHER PUBLICATIONS

Machine translation of JP 2006-077234A, printed Sep. 30, 2015.*
Jones, "Fluoropolymers for Coating Applications", Sep. 2008, JCT Coatings Tech, 10 pages.*
International Search Report issued in PCT/JP2013/084252, mailed on Mar. 4, 2014.
New Experimental Chemistry Series #8, "Synthesis of Inorganic Compound III", Maruzen Co., Ltd., 1977, pp. 1166-1167.
Written Opinion issued in PCT/JP2013/084252, mailed on Mar. 4, 2014.
European Search Report dated Sep. 30, 2015 for EP Application No. 13854194.1.

* cited by examiner

*Primary Examiner* — Matthew E Hoban
*Assistant Examiner* — Lynne Edmondson
(74) *Attorney, Agent, or Firm* — Birch, Stewart, Kolasch & Birch, LLP

(57) ABSTRACT

A red phosphor in the form of a Mn-activated complex fluoride having the formula: $A_2MF_6$:Mn wherein M is one or more tetravalent elements selected from Si, Ti, Zr, Hf, Ge, and Sn, and A is one or more alkali metals selected from Li, Na, K, Rb, and Cs, and contains at least Na and/or K, is surface treated with a treating solution containing a surface treating agent selected from an organic amine, quaternary ammonium salt, alkyl betaine or fluorochemical surfactant, alkoxysilane, and fluorinated polymer.

7 Claims, No Drawings

PHOSPHOR SURFACE TREATMENT METHOD

TECHNICAL FIELD

This invention relates to a phosphor surface treatment method.

BACKGROUND ART

For the purpose of adding red tone to the emission color of white light emitting diodes (LED) to lower the overall color temperature or improve color rendering, there is a need for phosphors capable of red emission upon excitation with light corresponding to near-UV to blue LED. While research works have been made thereon, JP-A 2009-528429 (Patent Document 1) describes that a complex fluoride phosphor material is obtained by doping a useful complex fluoride of the formula: $A_2MF_6$ (wherein A is Na, K, Rb or the like and M is Si, Ge, Ti or the like) with Mn.

As an improvement over the method of Patent Document 1, the inventors developed in JP-A 2012-224536 (Patent Document 2) a method for preparing a complex fluoride of the formula: $A_2MF_6$ by the steps of dissolving an oxide, hydroxide, carbonate or fluoride of tetravalent element M such as Si or Ti in hydrofluoric acid to form a first solution containing a fluoride or polyfluoro-acid salt of tetravalent element M in a substantial sense, providing a second solution containing an alkali fluoride AF (wherein A is K, Na, Li or the like) such as potassium fluoride or potassium hydrogenfluoride, mixing the first solution with the second solution to form a precipitate of complex fluoride, and recovering the precipitate by filtration or another technique; and a method for preparing a phosphor of the formula: $A_2MF_6$:Mn by the step of previously adding a Mn compound of the formula: $K_2MnF_6$ to at least either one of the first solution and the second solution.

On the other hand, a possibility is pointed out that these complex fluoride phosphors degrade their luminescent properties under high temperature/humidity conditions. Referring to the possibility, JP-A 2009-280763 (Patent Document 3) describes that the problem of humidity resistance is mitigated if the LED manufacture process is modified by mixing a phosphor with a silicone resin and molding the resin. Also JP-A 2010-045328 (Patent Document 4) describes that the problem of humidity resistance is mitigated by coating a complex fluoride phosphor with a resin or the like prior to the manufacture of LED.

In the LED manufacture process, however, the phosphor is used at varying stages and under varying conditions, and the form of phosphor used in LED products widely varies. In some cases, it is difficult to apply the above countermeasure. It is thus desirable that the humidity resistance of a phosphor powder itself be improved, that is, a lowering of emission intensity in a high humidity atmosphere be minimized.

CITATION LIST

Patent Documents

Patent Document 1: JP-A 2009-528429
Patent Document 2: JP-A 2012-224536
Patent Document 3: JP-A 2009-280763
Patent Document 4: JP-A 2010-045328

Non-Patent Document

Non-Patent Document 1: New Experimental Chemistry Series #8, "Synthesis of Inorganic Compound III", MARUZEN CO., LTD., p 1166, 1977

SUMMARY OF INVENTION

Technical Problem

An object of the invention, which has been made under the above-mentioned circumstances, is to provide a phosphor surface treatment method capable of improving humidity resistance of a phosphor.

Solution to Problem

With the expectation that phosphor would be improved in humidity resistance by attaching hydrophobic molecules or functional groups to surfaces of phosphor particles, the inventors made extensive investigations on the treatment of phosphor particles with a wide variety of polymeric materials and surfactants. The inventors have found that a phosphor is improved in humidity resistance when it is treated with a solution containing a surface treating agent selected from (A) organic amine, (B) quaternary ammonium salt, (C) alkyl betaine or fluorochemical surfactant, (D) alkoxysilane, and (E) fluorinated polymer.

Accordingly, the present invention provides a phosphor surface treatment method as defined below.

[1] A phosphor surface treatment method comprising the step of treating the surface of a red phosphor with a treating solution containing a surface treating agent, wherein the red phosphor is a Mn-activated complex fluoride having the formula (1):

$$A_2MF_6:Mn \quad (1)$$

wherein M is one or more tetravalent elements selected from the group consisting of Si, Ti, Zr, Hf, Ge, and Sn, and A is one or more alkali metals selected from the group consisting of Li, Na, K, Rb, and Cs, and contains at least Na and/or K, and the surface treating agent is selected from the group consisting of:

(A) an organic amine having the formula (2):

$$NR^1R^2R^3 \quad (2)$$

wherein at least one of $R^1$, $R^2$ and $R^3$ is a substituted or unsubstituted monovalent hydrocarbon group, and the remainder is hydrogen, (B) a quaternary ammonium salt having the formula (2-1):

$$R^4R^5R^6R^7N^+X^- \quad (2-1)$$

wherein $R^4$, $R^5$, $R^6$ and $R^7$ each are a substituted or unsubstituted monovalent hydrocarbon group, and X is a halogen atom, (C) an alkyl betaine or a fluorochemical surfactant, having the formula (2-2):

$$R^8R^9R^{10}N^+CH_2COO^- \quad (2-2)$$

wherein $R^8$, $R^9$ and $R^{10}$ each are a substituted or unsubstituted monovalent hydrocarbon group, (D) an alkoxysilane having the formula (2-3):

$$R^{11}Si(OR^{12})(OR^{13})(OR^{14}) \quad (2-3)$$

wherein $R^{11}$ is a substituted or unsubstituted monovalent hydrocarbon group or alkoxy group, $R^{12}$, $R^{13}$ and $R^{14}$ each are a substituted or unsubstituted monovalent hydrocarbon group, and (E) a fluorinated polymer.

[2] The phosphor surface treatment method of [1] wherein the treating solution is an aqueous solution of the surface treating agent containing hydrofluoric acid or an organic solvent solution of the surface treating agent.

[3] The phosphor surface treatment method of [1] or [2] wherein the treating solution further contains a complex fluoride having the formula (3):

$$A_2MF_6 \quad (3)$$

wherein M is one or more tetravalent elements selected from the group consisting of Si, Ti, Zr, Hf, Ge, and Sn, and A is one or more alkali metals selected from the group consisting of Li, Na, K, Rb, and Cs, and contains at least Na and/or K.

[4] The phosphor surface treatment method of any one of [1] to [3] wherein said red phosphor is a Mn-activated complex fluoride having the formula (1), which is obtained through the steps of:

adding a manganese compound of the formula: $Na_2MnF_6$ or $K_2MnF_6$ to at least one of a first solution containing a fluoride of a tetravalent element M wherein M is one or more elements selected from the group consisting of Si, Ti, Zr, Hf, Ge, and Sn, and a second solution containing a compound selected from the group consisting of a fluoride, hydrogenfluoride, nitrate, sulfate, hydrogensulfate, carbonate, hydrogencarbonate, and hydroxide of an alkali metal A wherein A is one or more metals selected from the group consisting of Li, Na, K, Rb, and Cs, and/or a solid compound of the alkali metal A, and mixing the first solution with the second solution and/or the solid compound for thereby reacting the fluoride of tetravalent element M, the compound of alkali metal A, and the manganese compound.

[5] The phosphor surface treatment method of any one of [1] to [4] wherein said red phosphor is in particulate form of particle size distribution having a 50% by volume cumulative particle diameter D50 of at least 2 μm and a 90% by volume cumulative particle diameter D90 of up to 60 μm.

[6] The phosphor surface treatment method of any one of [1] to [5] wherein the treating step includes immersing the red phosphor in the treating solution.

Advantageous Effects of Invention

According to the invention, a surface treating agent is strongly adsorbed to the surface of a red phosphor while it possesses hydrophobic groups such as hydrocarbon groups that exhibit hydrophobic properties. Thus the red phosphor is improved in humidity resistance.

DESCRIPTION OF EMBODIMENTS

Now the phosphor surface treatment method of the invention is described with reference to one embodiment.

The phosphor surface treatment method of the invention is characterized by the step of treating the surface of a red phosphor with a treating solution (coating treatment solution) containing a surface treating agent, wherein the red phosphor is a Mn-activated complex fluoride having the formula (1):

$$A_2MF_6:Mn \quad (1)$$

wherein M is one or more tetravalent elements selected from Si, Ti, Zr, Hf, Ge, and Sn, and A is one or more alkali metals selected from Li, Na, K, Rb, and Cs, and contains at least Na and/or K, and the surface treating agent is selected from:

(A) an organic amine having the formula (2):

$$NR^1R^2R^3 \quad (2)$$

wherein at least one of $R^1$, $R^2$ and $R^3$ is a substituted or unsubstituted monovalent hydrocarbon group, and the remainder is hydrogen, (B) a quaternary ammonium salt having the formula (2-1):

$$R^4R^5R^6R^7N^+X^- \quad (2-1)$$

wherein $R^4$, $R^5$, $R^6$ and $R^7$ each are a substituted or unsubstituted monovalent hydrocarbon group, and X is a halogen atom, (C) an alkyl betaine or a fluorochemical surfactant, having the formula (2-2):

$$R^8R^9R^{10}N^+CH_2COO^- \quad (2-2)$$

wherein $R^8$, $R^9$ and $R^{10}$ each are a substituted or unsubstituted monovalent hydrocarbon group, (D) an alkoxysilane having the formula (2-3):

$$R^{11}Si(OR^{12})(OR^{13})(OR^{14}) \quad (2-3)$$

wherein $R^{11}$ is a substituted or unsubstituted monovalent hydrocarbon group or alkoxy group, $R^{12}$, $R^{13}$ and $R^{14}$ each are a substituted or unsubstituted monovalent hydrocarbon group, and (E) a fluorinated polymer.

Red Phosphor

The red phosphor used herein is a manganese-activated complex fluoride phosphor of structure that one or more constituent of a complex fluoride $A_2MF_6$ is, in part, replaced by manganese. In this manganese-activated complex fluoride phosphor, the activator, manganese is preferably a replacement at the site of tetravalent element in $A_2MF_6$, that is, as tetravalent manganese ($Mn^{4+}$). In this case, the phosphor may also be represented as $A_2MF_6:Mn^{4+}$. Inter alia, the complex fluoride phosphor is most preferably a manganese (Mn)-activated potassium silicofluoride of the formula:

$K_2SiF_6:Mn.$

The Mn-activated complex fluoride phosphor emits red light having a luminescent peak or maximum luminescent peak in a wavelength range of 600 to 660 nm, when excited with blue light of wavelength 420 to 490 nm.

In one preferred embodiment of the invention, use is made of a complex fluoride phosphor prepared by the method disclosed in JP-A 2012-224536 (Patent Document 2), that is, a Mn-activated complex fluoride of formula (1) prepared by adding a manganese compound of the formula: $Na_2MnF_6$ or $K_2MnF_6$ to at least one of a first solution containing a fluoride of a tetravalent element M wherein M is one or more elements selected from Si, Ti, Zr, Hf, Ge, and Sn, and a second solution containing a compound selected from a fluoride, hydrogenfluoride, nitrate, sulfate, hydrogensulfate, carbonate, hydrogencarbonate, and hydroxide of an alkali metal A wherein A is one or more metals selected from Li, Na, K, Rb, and Cs, and/or a solid compound of the alkali metal A, and mixing the first solution with the second solution and/or the solid compound for thereby reacting the fluoride of tetravalent element M, the compound of alkali metal A, and the manganese compound.

More particularly, the complex fluoride phosphor may be prepared by the following method. At the start, a first solution containing a fluoride of a tetravalent element M wherein M is one or more elements selected from Si, Ti, Zr, Hf, Ge, and Sn, preferably Si and/or Ti, and a second solution containing a compound selected from a fluoride, hydrogenfluoride salt, nitric acid salt, sulfuric acid salt, hydrogensulfate salt, carbonic acid salt, hydrogencarbonate salt, and hydroxide of an alkali metal A wherein A is one or more metals selected from Li, Na, K, Rb, and Cs, preferably Na and/or K, and/or a solid compound of the alkali metal A are prepared so that they may be ready for use.

The first solution is typically prepared as aqueous solution. The aqueous solution may be prepared by dissolving a fluoride of tetravalent element M in water optionally together with hydrogen fluoride or hydrofluoric acid aqueous solution. Alternatively, an oxide, hydroxide or carbonate of tetravalent element M may be dissolved in water together with hydrogen fluoride or hydrofluoric acid aqueous solution to form the aqueous solution. The resulting aqueous solution is substantially an aqueous solution containing the fluoride or polyfluoro-acid salt (for example, hexafluorosilicic acid salt) of tetravalent element M.

In the first solution, the concentration of the fluoride of tetravalent element M is preferably 0.1 to 3 mole/liter, more preferably 0.2 to 1.5 mole/liter. Hydrogen fluoride (or hydrofluoric acid aqueous solution) is preferably added in an amount of 0 to 30 mole/liter, especially 0.1 to 27 mole/liter, so that a molar ratio of fluorine to tetravalent element M may be at least 6, more preferably at least 8. The upper limit of the molar ratio of fluorine to tetravalent element M is typically up to 100, though not critical. During preparation of the first solution, it may be cooled or heated at a temperature of 0 to 100° C., especially 20 to 80° C., if necessary.

The second solution may be prepared as aqueous solution by dissolving a compound of alkali metal A in water, optionally together with hydrogen fluoride (hydrofluoric acid aqueous solution). Herein A is one or more alkali metals selected from Li, Na, K, Rb, and Cs, preferably Na and/or K, and the compound of alkali metal A is selected from a fluoride AF, hydrogenfluoride salt $AHF_2$, nitric acid salt $ANO_3$, sulfuric acid salt $A_2SO_4$, hydrogensulfate salt $AHSO_4$, carbonic acid salt $A_2CO_3$, hydrogencarbonate salt $AHCO_3$, and hydroxide AOH. When a solid (corresponding to the second solution) is used, a compound selected from fluoride AF, hydrogen fluoride salt $AHF_2$, nitric acid salt $ANO_3$, sulfuric acid salt $A_2SO_4$, hydrogensulfate salt $AHSO_4$, carbonic acid salt $A_2CO_3$, hydrogencarbonate salt $AHCO_3$, and hydroxide AOH may be provided as solid.

In the second solution, the concentration of the compound of alkali metal A is preferably at least 0.02 mole/liter, more preferably at least 0.05 mole/liter as alkali metal A. The upper limit of concentration of alkali metal A is typically up to 10 mole/liter, though not critical. During preparation of the second solution, it may be cooled or heated at a temperature of 0 to 100° C., especially 20 to 80° C., if necessary.

Next the first solution is mixed with the second solution and/or the solid whereupon the fluoride of tetravalent element M reacts with the compound of alkali metal A. Prior to this step, at least one (i.e., either one or both) of the first solution and the second solution and/or the solid has been prepared by adding at least one (i.e., either one or both) of manganese compounds of the formula: $Na_2MnF_6$ and $K_2MnF_6$ thereto, so that the solution may be ready for use (mixing). In formula (1), Na and/or K is essential as the alkali metal A.

The manganese compound is preferably added in such an amount that tetravalent metal M and Mn are present in the combined raw material (that is, the first solution and the second solution and/or solid combined) in a range: 70 mol % ≤ M < 100 mol %, specifically 85 mol % ≤ M ≤ 99.9 mol %, and 0 mol % < Mn ≤ 30 mol %, specifically 0.1 mol % ≤ Mn ≤ 15 mol %, and more specifically 0.5 mol % ≤ Mn ≤ 10 mol %, provided that M+Mn=100 mol %. This proportion is correlated to the proportion of tetravalent metal M and Mn in the resulting complex fluoride phosphor.

Herein, the ratio of the alkali metal A in the second solution and/or solid to the tetravalent metal M in the first solution and Mn in the manganese compound added, that is, A/(M+Mn) is preferably in a range from 2.0 to 10.0 (molar ratio), especially from 2.0 to 5.0 (molar ratio).

Next the first solution is mixed with the second solution and/or the solid whereupon the fluoride of tetravalent element M reacts with the compound of alkali metal A and the manganese compound. Preferably they are carefully and gradually mixed because their mixing is sometimes exothermic. The reaction temperature is typically −20° C. to 100° C., preferably 0° C. to 80° C. The reaction time is typically 10 seconds to 1 hour. Once the first solution is mixed with the second solution and/or the solid, reaction takes place to form a solid product (or precipitate). In this regard, the first solution is preferably mixed with the second solution and/or the solid in such amounts that the solution at the end of reaction may contain the solid product in a concentration of 1 to 20% by weight as solids.

The reaction solution is subjected to solid-liquid separation, for example, filtration, centrifugation or decantation, whereby the desired complex fluoride phosphor is recovered as a solid product. At this point, the step of concentrating the reaction solution is unnecessary. It is noted that the solid product recovered by solid-liquid separation may be post-treated such as by washing or solvent exchange, and dried such as by vacuum drying, if necessary. As long as the liquid is removed by solid-liquid separation, the solid product (precipitate) resulting from the above reaction is ready for subsequent use in the surface treatment method of the invention.

The Mn-activated complex fluoride phosphor is in particulate form of particle size distribution preferably having a 50% by volume cumulative particle diameter D50 of at least 2 μm, more preferably 5 to 40 μm, and a 90% by volume cumulative particle diameter D90 of up to 60 μm, more preferably 15 to 50 μm. If D50 is less than 2 μm, a proportion of scattering excitation light from blue LED or the like may become greater than a proportion of absorption and conversion, which is inadequate. Although the maximum of D50 is not definitely limited, a D50 value of up to 40 μm is preferred from its relationship to D90. If D90 exceeds 60 μm, such particles may be inconvenient to admix with a resin for mounting to LED.

It is noted that a method of measuring a particle size by dispersing powder particles in a gas stream and measuring by the laser diffraction scattering technique, for example, is preferably used in the invention because particle size distribution can be evaluated as well.

The complex fluoride phosphor used herein may be prepared by any prior art well-known methods. For example, use may be made of a product obtained by dissolving or dispersing metal fluoride raw materials in hydrofluoric acid, and heating the solution or dispersion until it is evaporated to dryness, or a product obtained by completely dissolving metal fluoride raw materials in hydrofluoric acid, and cooling the solution or adding an organic solvent to the solution for lowering solubility until a precipitate deposits.

Coating Treatment Solution

As alluded to previously, the coating treatment solution used herein is a treating solution containing a surface treating agent selected from the following:

(A) an organic amine having the formula (2):

$$NR^1R^2R^3 \tag{2}$$

wherein at least one of $R^1$, $R^2$ and $R^3$ is a substituted or unsubstituted monovalent hydrocarbon group, and the remainder is hydrogen, (B) a quaternary ammonium salt having the formula (2-1):

$$R^4R^5R^6R^7N^+X^- \quad (2\text{-}1)$$

wherein $R^4$, $R^5$, $R^6$ and $R^7$ each are a substituted or unsubstituted monovalent hydrocarbon group, and X is a halogen atom, (C) an alkyl betaine or a, having the formula (2-2):

$$R^8R^9R^{10}N^+CH_2COO^- \quad (2\text{-}2)$$

wherein $R^8$, $R^9$ and $R^{10}$ each are a substituted or unsubstituted monovalent hydrocarbon group, (D) an alkoxysilane having the formula (2-3):

$$R^{11}Si(OR^{12})(OR^{13})(OR^{14}) \quad (2\text{-}3)$$

wherein $R^{11}$ is a substituted or unsubstituted monovalent hydrocarbon group or alkoxy group, $R^{12}$, $R^{13}$ and $R^{14}$ each are a substituted or unsubstituted monovalent hydrocarbon group, and (E) a fluorinated polymer.

(A) Organic Amine

The organic amine may be a primary, secondary or tertiary amine as long as it meets formula (2). A relatively highly hydrophobic compound or differently stated, less water-soluble compound is preferred. In formula (2), the total carbon count in $R^1$, $R^2$ and $R^3$ is at least 1, preferably at least 2.

As long as the total carbon count in hydrocarbon group(s) per molecule is at least 1, preferably at least 2, more preferably at least 4, and even more preferably at least 8, the organic amine adsorbed to the surface of a red phosphor prevents the influence of water on the red phosphor due to the hydrophobic property of hydrocarbon group the organic amine possesses, whereby the humidity resistance of the red phosphor is improved. From the standpoint of improving the humidity resistance of the red phosphor, it is preferred that the carbon count in at least one hydrocarbon group in a molecule be at least 4, and more preferably at least 8. The monovalent hydrocarbon group may be either a saturated aliphatic group such as alkyl or an unsaturated aliphatic group. Also it may be either a substituted monovalent hydrocarbon group in which some or all hydrogen atoms are substituted by fluorine atoms or other radicals or an unsubstituted monovalent hydrocarbon group. Further, it may be straight or branched or contain an intermediate carbocycle, with a straight group being preferred. Although the upper limit of the total carbon count in hydrocarbon group(s) is not critical, a carbon count of up to 24 is preferred for availability.

Accordingly, examples of the organic amine used herein are as follows. Suitable primary amines include straight amines such as methylamine, ethylamine, propylamine, butylamine, pentylamine, hexylamine, heptylamine, octylamine, nonylamine, decylamine, undecylamine, dodecylamine, tridecylamine, tetradecylamine, pentadecylamine, hexadecylamine, heptadecylamine, and octadecylamine; branched amines such as 2-ethylhexylamine; cyclic saturated aliphatic monoamines such as cyclopropylamine; and unsaturated aliphatic monoamines such as allylamine and oleylamine.

Suitable secondary amines include dimethylamine, diethylamine, dipropylamine, dibutylamine, dipentylamine, dihexylamine, diheptylamine, dioctylamine, dinonylamine, didecylamine, diundecylamine, didodecylamine, methylethylamine, N-methyl-n-propylamine, N-ethyl-n-propylamine, and n-propyl-n-butylamine.

Suitable tertiary amines include trimethylamine, triethylamine, tripropylamine, tributylamine, trihexylamine, and trioctylamine.

(B) Quaternary Ammonium Salt

Any quaternary ammonium salt may be used as long as it meets formula (2-1). A relatively highly hydrophobic compound or differently stated, less water-soluble compound is preferred. In formula (2-1), the total carbon count in $R^4$, $R^5$, $R^6$ and $R^7$ is at least 4, and X is a halogen atom such as fluorine, chlorine, bromine or iodine.

As long as the total carbon count in hydrocarbon groups per molecule is at least 4, preferably at least 8, the quaternary ammonium salt adsorbed to the surface of a red phosphor prevents the influence of water on the red phosphor due to the hydrophobic property of hydrocarbon groups the quaternary ammonium salt possesses, whereby the humidity resistance of the red phosphor is improved. From the standpoint of improving the humidity resistance of the red phosphor, it is preferred that the carbon count in at least one hydrocarbon group in a molecule be at least 4, and more preferably at least 8. The monovalent hydrocarbon group may be either a saturated aliphatic group such as alkyl or an unsaturated aliphatic group. Also it may be either a substituted monovalent hydrocarbon group in which some or all hydrogen atoms are substituted by fluorine atoms or other radicals or an unsubstituted monovalent hydrocarbon group. Further, it may be straight or branched or contain an intermediate carbocycle, with a straight group being preferred. Although the upper limit of the total carbon count in hydrocarbon groups is not critical, a carbon count of up to 40 is preferred for availability.

Examples of the quaternary ammonium salt used herein include cetyltrimethylammonium bromide, methyltrioctylammonium chloride, benzalkonium chloride, benzethonium chloride, tetraethylammonium bromide, and cetylpyridinium chloride.

(C) Alkyl Betaine or Fluorochemical Surfactant

Any alkyl betaine may be used as long as it meets formula (2-2). A relatively highly hydrophobic compound or differently stated, less water-soluble compound is preferred. In formula (2-2), the total carbon count in $R^8$, $R^9$ and $R^{10}$ is at least 3.

As long as the total carbon count in hydrocarbon groups per molecule is at least 3, preferably at least 6, the alkyl betaine adsorbed to the surface of a red phosphor prevents the influence of water on the red phosphor due to the hydrophobic property of hydrocarbon groups the alkyl betaine possesses, whereby the humidity resistance of the red phosphor is improved. From the standpoint of improving the humidity resistance of the red phosphor, it is preferred that the carbon count in at least one hydrocarbon group in a molecule be at least 3, and more preferably at least 5. The monovalent hydrocarbon group may be either a saturated aliphatic group such as alkyl or an unsaturated aliphatic group. Also it may be either a substituted monovalent hydrocarbon group in which some or all hydrogen atoms are substituted by fluorine atoms or other radicals or an unsubstituted monovalent hydrocarbon group. Further, it may be straight or branched or contain an intermediate carbocycle, with a straight group being preferred. Although the upper limit of the total carbon count in hydrocarbon groups is not critical, a carbon count of up to 20 is preferred for availability. Of the monovalent hydrocarbon groups, fluoroalkyl groups such as perfluoroalkyl groups are most preferred.

The fluorochemical surfactant is highly hydrophobic. The fluorochemical surfactant adsorbed to the surface of a red phosphor prevents the influence of water on the red phosphor due to its hydrophobic property, whereby the humidity resistance of the red phosphor is improved.

Suitable alkyl betaines used herein include fluoroalkyl betaines such as perfluoroalkyl betaines, and lauryl betaine, stearyl betaines, and lauramide propyl betaine. Suitable fluorochemical surfactants include fluoroalkyl betaines such as perfluoroalkyl betaines, and ampholytic or cationic fluoroalkyl surfactants such as perfluoroalkyltrimethylammonium chloride.

(D) Alkoxysilane

Any alkoxysilane may be used as long as it meets formula (2-3). A relatively highly hydrophobic compound or differently stated, less water-soluble compound is preferred. In formula (2-3), the total carbon count in $R^{11}$, $R^{12}$, $R^{13}$ and $R^{14}$ is at least 4.

As long as the total carbon count in hydrocarbon groups per molecule is at least 4, preferably at least 6, the alkoxysilane adsorbed to the surface of a red phosphor prevents the influence of water on the red phosphor due to the hydrophobic property of hydrocarbon groups the alkoxysilane possesses, whereby the humidity resistance of the red phosphor is improved. From the standpoint of improving the humidity resistance of the red phosphor, it is preferred that the carbon count in at least one hydrocarbon group in a molecule be at least 2, and more preferably at least 4. The monovalent hydrocarbon group may be either a saturated aliphatic group such as alkyl, unsaturated aliphatic group, or polyether group. Also it may be either a substituted monovalent hydrocarbon group in which some or all hydrogen atoms are substituted by fluorine atoms, amino or other radicals or an unsubstituted monovalent hydrocarbon group. Further, it may be straight or branched or contain an intermediate carbocycle, with a straight group being preferred. The alkoxy group may be straight or branched or contain an intermediate carbocycle, with a straight group being preferred. Although the upper limit of the total carbon count in hydrocarbon groups is not critical, a carbon count of up to 30 is preferred for availability. Of the monovalent hydrocarbon groups, fluoroalkyl groups such as perfluoroalkyl groups, aminoalkyl groups (especially aminoalkyl groups having an amino group at the end), fluoro polyether groups such as perfluoropolyether, and unsubstituted alkyl groups are preferred. More preferably $R^{11}$ is a fluoroalkyl, aminoalkyl, fluoropolyether or alkoxy group, and $R^{12}$, $R^{13}$ and $R^{14}$ are unsubstituted alkyl groups (i.e., $OR^{12}$, $OR^{13}$ and $OR^{14}$ are alkoxy groups).

Suitable alkoxysilanes used herein include tetraethyl orthosilicate, alkoxysilanes such as methyltrimethoxysilane, ethyltrimethoxysilane, n-propyltrimethoxysilane, vinyltrimethoxysilane, and 3,3,3-trifluoropropyltrimethoxysilane; aminoalkyltrialkoxysilanes (silane coupling agents) such as 3-aminopropyltriethoxysilane and N-2-(aminoethyl)-3-aminopropyltrimethoxylane; and perfluoropolyether group-containing alkoxysilanes such as perfluoropolyether group-containing trialkoxysilanes, e.g., fluorinated anti-smudge coating KY108 (trade name KY108 by Shin-Etsu Chemical Co., Ltd.).

(E) Fluorinated Polymer

The fluorinated polymer is highly hydrophobic. The fluorinated polymer adsorbed to the surface of a red phosphor prevents the influence of water on the red phosphor due to its hydrophobic property, whereby the humidity resistance of the red phosphor is improved.

Suitable fluorinated polymers used herein include, for example, polyvinylidene fluoride and poly(fluoroalkyl acrylate).

The surface treating agent may be used in an amount of about 0.2 to 50 g, preferably 0.5 to 30 g or 1.5 to 200 mmol, and more preferably 1.0 to 20 g or 5.0 to 150 mmol per 100 g of the red phosphor (Mn-activated complex fluoride phosphor) to be surface treated therewith. If the amount of the surface treating agent is less than 0.2 g, the red phosphor may not be fully coated, leading to insufficient improvement in humidity resistance. If the amount of the surface treating agent is increased beyond 50 g, the coverage of the red phosphor may be saturated, with no further improvement in humidity resistance being expected.

The coating treatment solution is preferably an aqueous solution of the surface treating agent containing hydrofluoric acid. As to the amount of hydrofluoric acid added, preferably 50 wt % hydrofluoric acid aqueous solution is used in an amount which is at least equal in volume to water and at least 50 times the weight of the surface treating agent.

Also preferably, the coating treatment solution is a solution of the surface treating agent in an organic solvent. Suitable organic solvents include n-hexane, cyclohexane, acetone, butanone, toluene, xylene, N,N-dimethylformamide, and dioxane. Particularly when the surface treating agent is the fluorinated polymer (E), polar solvents such as N,N-dimethylformamide, acetone, butanone and dioxane are preferred.

Preferably the coating treatment solution further contains a complex fluoride having the formula (3):

$$A_2MF_6 \tag{3}$$

wherein M is one or more tetravalent elements selected from Si, Ti, Zr, Hf, Ge, and Sn, and A is one or more alkali metals selected from Li, Na, K, Rb, and Cs, and contains at least Na and/or K. This complex fluoride is preferably added in an amount of 0.5 to 5% by weight based on the total of water and hydrofluoric acid, or the organic solvent.

The coating treatment solution thus formulated is preferred particularly when a complex fluoride phosphor prepared by the method of JP-A 2012-224536 (Patent Document 2) is to be coated, because it ensures ease of coating treatment.

Treatment Method

According to the invention, the surface of the red phosphor is treated with the coating treatment solution formulated above.

The treatment technique may be any desired one as long as the coating treatment solution is sufficiently available on the surface of the red phosphor. For example, a technique of immersing the red phosphor in the coating treatment solution or a technique of spraying the coating treatment solution to the red phosphor may be used.

In the embodiment wherein coating treatment or surface treatment is carried out by immersing the red phosphor in the coating treatment solution, the red phosphor is first placed in the coating treatment solution. While the phosphor is kept immersed, the solution is agitated for about 1 minute to 1 hour and held stationary for about 1 minute to 1 hour. During the holding step, the coated red phosphor precipitates out.

The precipitate is recovered by solid-liquid separation, for example, filtration, centrifugation or decantation. This is followed by washing, solvent exchange, and vacuum drying, yielding the coated red phosphor.

With respect to the coating treatment with the coating treatment solution, after the red phosphor is treated with the coating treatment solution, treatment with a coating treatment solution containing a surface treating agent of the same or different type may be repeated one or more times. As the preferred sequence of such repetitive treatment, the phosphor is treated with a coating treatment solution containing a surface treating agent other than a perfluoropolyether group-containing alkoxysilane, for example, a coating treatment solution containing aminoalkyltrialkoxysilane, after which it is treated with a coating treatment solution containing a perfluoropolyether group-containing alkoxysilane.

The foregoing coating treatment yields a red phosphor having the surface treating agent adsorbed to surfaces of particles. More specifically, the surface treating agent adsorbs to surfaces of red phosphor particles, with its hydrophobic groups oriented outward or opposite to the red phosphor particles. Particularly when the surface treating agent is an organic amine, quaternary ammonium salt, alkyl betaine or aminoalkyltrialkoxysilane, the agent at its nitrogen atom side adsorbs to surfaces of red phosphor particles, with its hydrophobic hydrocarbon groups oriented outward or opposite to the red phosphor particles. As a result, the red phosphor surface is covered with hydrophobic groups such as hydrocarbon groups, to prevent water from acting on the red phosphor from outside, for example, to prevent the red phosphor from degrading its emission properties in a high humidity environment.

EXAMPLES

Examples and Comparative Examples are given below by way of illustration and not by way of limitation. Unless otherwise stated, the reagents used herein are available from Wako Pure Chemical Industries, Ltd. as extra pure or guaranteed grade chemicals.

Example 1

First, 234 cm$^3$ of 40 wt % hexafluorosilicic acid (H$_2$SiF$_6$) aqueous solution (Morita Chemical Industries Ltd.) was mixed with 2,660 cm$^3$ of 50 wt % hydrofluoric acid (HF) solution (SA-X, Stella Chemifa Corp.). To the mixture was added 13.32 g of K$_2$MnF$_6$ powder which had been prepared by the method to be described later. The fluoride was dissolved therein by stirring, obtaining a Mn-containing hexafluorosilicic acid solution.

Separately, 210.5 g of potassium hydrofluoride (KHF$_2$) was mixed with 680 cm$^3$ of 50 wt % hydrofluoric acid solution and 1,270 cm$^3$ of pure water and dissolved therein, obtaining a potassium hydrofluoride solution.

While the Mn-containing hexafluorosilicic acid solution was stirred, the potassium hydrofluoride solution was added in small divided portions, whereupon a pale orange precipitate (K$_2$SiF$_6$:Mn) formed. The precipitate was filtered through a Buchner funnel and deliquored as much as possible. The step until this point is designated crystallization step.

Separately, 11.6 g of potassium silicofluoride (K$_2$SiF$_6$) was dissolved in 500 cm$^3$ of 50 wt % hydrofluoric acid and 100 cm$^3$ of pure water, to which 2.77 g of n-octylamine (C$_8$H$_{17}$NH$_2$, total carbon count 8) was slowly added dropwise, obtaining a coating treatment solution.

The precipitate resulting from the crystallization step was added to the coating treatment solution, followed by 10 minutes of stirring and 10 minutes of static holding. The precipitate was filtered through a Buchner funnel, fully deliquored, washed with spraying acetone, deliquored, recovered and vacuum dried. As a result, 184.9 g of a powder product was obtained.

The particle size distribution of the powder product was analyzed by a gas stream dispersion type laser diffractometry particle size distribution measurement system (Helos & Rodos, Sympatec GmbH). As a result, particles with a particle size of up to 8.4 µm accounted for 10% of the total volume (D10=8.4 µm), particles with a particle size of up to 19.2 µm accounted for 50% of the total volume (D50=19.2 µm), and particles with a particle size of up to 29.3 µm accounted for 90% of the total volume (D90=29.3 µm).

Preparation of K$_2$MnF$_6$

K$_2$MnF$_6$ was prepared in accordance with the procedure described in New Experimental Chemistry Series #8, "Synthesis of Inorganic Compound III", MARUZEN CO., LTD., p 1166, 1977 (Non-Patent Document 1).

A reaction vessel of vinyl chloride resin was divided into two compartments by a central partition of fluororesin ion exchange membrane, and platinum plates were set as anode and cathode in the compartments. A hydrofluoric acid solution having manganese(II) fluoride dissolved therein was fed to the anode side compartment and a hydrofluoric acid solution was fed to the cathode side compartment. A power supply was connected to the electrodes to carry out electrolysis at a voltage of 3 V and a current flow of 0.75 A. At the end of electrolysis, a potassium fluoride aqueous solution saturated with hydrofluoric acid was added in excess to the reaction solution in the anode side compartment. There formed a yellow precipitate (identified as K$_2$MnF$_6$), which was filtered and recovered.

Example 2

Potassium silicofluoride (K$_2$SiF$_6$), 7.25 g, was dissolved in 300 cm$^3$ of 50 wt % hydrofluoric acid and 60 cm$^3$ of pure water, to which 6.72 g of trioctylamine ((C$_8$H$_{17}$)$_3$N, total carbon count 24) was slowly added dropwise, obtaining a coating treatment solution.

To the coating treatment solution was added 100 g of a phosphor powder which had been prepared as in Example 1 until the crystallization step and recovered by vacuum drying. This was followed by 10 minutes of stirring and 10 minutes of static holding. The precipitate was filtered through a Buchner funnel, fully deliquored, washed with spraying acetone, deliquored, recovered and vacuum dried. As a result, 98.9 g of a powder product was obtained.

The particle size distribution of the powder product was analyzed as in Example 1, with the results: D10=10.4 µm, D50=21.4 µm, and D90=32.9 µm.

Example 3

The procedure of Example 1 was repeated except that 2.77 g of 2-ethylhexylamine ((C$_4$H$_9$)(C$_2$H$_5$)CHCH$_2$NH$_2$, total carbon count 8) was added instead of n-octylamine during the preparation of a coating treatment solution, obtaining 175.7 g of a powder product.

The particle size distribution of the powder product was analyzed as in Example 1, with the results: D10=10.0 µm, D50=20.1 µm, and D90=29.2 µm.

Example 4

The procedure of Example 1 was repeated except that 2.93 g of di-n-butylamine ((C$_4$H$_9$)$_2$NH, total carbon count 8) was added instead of n-octylamine during the preparation of a coating treatment solution, obtaining 179.1 g of a powder product.

The particle size distribution of the powder product was analyzed as in Example 1, with the results: D10=11.9 µm, D50=22.5 µm, and D90=33.0 µm.

Example 5

The procedure of Example 1 was repeated except that 5.18 g of dioctylamine (($C_8H_{17}$)$_2$NH, total carbon count 16) was added instead of n-octylamine during the preparation of a coating treatment solution, obtaining 178.6 g of a powder product.

The particle size distribution of the powder product was analyzed as in Example 1, with the results: D10=12.3 μm, D50=25.1 μm, and D90=36.6 μm.

Example 6

Potassium silicofluoride ($K_2SiF_6$), 2.18 g, was dissolved in 90 cm$^3$ of 50 wt % hydrofluoric acid and 18 cm$^3$ of pure water, to which 0.2 g of allylamine ($C_3H_5NH_2$, total carbon count 3, Wako Pure Chemical Industries, Ltd.) was added, obtaining a coating treatment solution.

To the coating treatment solution was added 30 g of a phosphor powder which had been prepared as in Example 1 until the crystallization step and recovered by vacuum drying. This was followed by 10 minutes of stirring and 10 minutes of static holding. The precipitate was filtered through a Buchner funnel, fully deliquored, washed with spraying acetone, deliquored, recovered and vacuum dried. As a result, 29.2 g of a powder product was obtained.

The particle size distribution of the powder product was analyzed as in Example 1, with the results: D10=8.2 μm, D50=18.9 μm, and D90=30.4 μm.

Example 7

To 100 cm$^3$ of n-hexane, 1.00 g of trioctylamine (($C_8H_{17}$)$_3$N, total carbon count 24) was slowly added dropwise, obtaining a coating treatment solution.

To the coating treatment solution was added 50 g of a phosphor powder which had been prepared as in Example 1 until the crystallization step and recovered by vacuum drying. This was followed by 10 minutes of stirring and 10 minutes of static holding. The precipitate was filtered through a Buchner funnel, fully deliquored, washed with spraying acetone, deliquored, recovered and vacuum dried. As a result, 48.9 g of a powder product was obtained.

The particle size distribution of the powder product was analyzed as in Example 1, with the results: D10=9.4 μm, D50=20.7 μm, and D90=31.4 μm.

Example 8

Potassium silicofluoride ($K_2SiF_6$), 7.25 g, was dissolved in 300 cm$^3$ of 50 wt % hydrofluoric acid and 60 cm$^3$ of pure water. 2.1 g of cetyltrimethylammonium bromide ($C_{16}H_{33}$($CH_3$)$_3$N$^+$Br$^-$, total carbon count 19, Tokyo Chemical Industry Co., Ltd.) was added thereto, obtaining a coating treatment solution.

To the coating treatment solution was added 100 g of a phosphor powder which had been prepared as in Example 1 until the crystallization step and recovered by vacuum drying. This was followed by 10 minutes of stirring and 10 minutes of static holding. The precipitate was filtered through a Buchner funnel, fully deliquored, washed with spraying acetone, deliquored, recovered and vacuum dried. As a result, 98.9 g of a powder product was obtained.

The particle size distribution of the powder product was analyzed as in Example 1, with the results: D10=9.6 μm, D50=20.3 μm, and D90=30.3 μm.

Example 9

Potassium silicofluoride ($K_2SiF_6$), 2.90 g, was dissolved in 120 cm$^3$ of 50 wt % hydrofluoric acid and 24 cm$^3$ of pure water. 2.15 g of methyltrioctylammonium chloride ($CH_3$($C_8H_{17}$)$_3$N$^+$Cl$^-$, total carbon count 25, Wako Pure Chemical Industries, Ltd.) was added thereto, obtaining a coating treatment solution.

To the coating treatment solution was added 40 g of a phosphor powder which had been prepared as in Example 1 until the crystallization step and recovered by vacuum drying. This was followed by 10 minutes of stirring and 10 minutes of static holding. The precipitate was filtered through a Buchner funnel, fully deliquored, washed with spraying acetone, deliquored, recovered and vacuum dried. As a result, 39.0 g of a powder product was obtained.

The particle size distribution of the powder product was analyzed as in Example 1, with the results: D10=11.0 μm, D50=21.3 μm, and D90=31.1 μm.

Example 10

Potassium silicofluoride ($K_2SiF_6$), 2.90 g, was dissolved in 120 cm$^3$ of 50 wt % hydrofluoric acid and 24 cm$^3$ of pure water. 2.31 g of fluorochemical ampholytic surfactant Surflon S-231 (trade name by AGC Seimi Chemical Co., Ltd., perfluoroalkyl betaine, total carbon count 6) was added thereto, obtaining a coating treatment solution.

To the coating treatment solution was added 40 g of a phosphor powder which had been prepared as in Example 1 until the crystallization step and recovered by vacuum drying. This was followed by 10 minutes of stirring and 10 minutes of static holding. The precipitate was filtered through a Buchner funnel, fully deliquored, washed with spraying acetone, deliquored, recovered and vacuum dried. As a result, 39.0 g of a powder product was obtained.

The particle size distribution of the powder product was analyzed as in Example 1, with the results: D10=10.9 μm, D50=21.2 μm, and D90=31.3 μm.

Example 11

There was provided 50 cm$^3$ of tetraethyl orthosilicate (($C_2H_5O$)$_4$Si, total carbon count 8).

To this was added 25 g of a phosphor powder which had been prepared as in Example 1 until the crystallization step and recovered by vacuum drying. This was followed by 10 minutes of stirring and 10 minutes of static holding. The precipitate was filtered through a Buchner funnel, fully deliquored, washed with spraying acetone, deliquored, recovered and vacuum dried. As a result, 23.2 g of a powder product was obtained.

The particle size distribution of the powder product was analyzed as in Example 1, with the results: D10=8.4 μm, D50=19.3 μm, and D90=29.6 μm.

Example 12

There was provided 50 cm$^3$ of methyltrimethoxysilane (($CH_3O$)$_3$SiCH$_3$, total carbon count 4, trade name LS-530 by Shin-Etsu Chemical Co., Ltd.).

To the silane was added 25 g of a phosphor powder which had been prepared as in Example 1 until the crystallization step and recovered by vacuum drying. This was followed by 10 minutes of stirring and 10 minutes of static holding. The precipitate was filtered through a Buchner funnel, fully deliquored, washed with spraying acetone, deliquored, recovered and vacuum dried. As a result, 23.2 g of a powder product was obtained.

The particle size distribution of the powder product was analyzed as in Example 1, with the results: D10=8.3 μm, D50=19.4 μm, and D90=29.8 μm.

Example 13

Potassium silicofluoride ($K_2SiF_6$), 5.80 g, was dissolved in 240 cm³ of 50 wt % hydrofluoric acid and 40 cm³ of pure water. 1.3 g of 3-aminopropyltriethoxysilane (($C_2H_5O)_3SiC_3H_6NH_2$, total carbon count 9, trade name LS-3150 by Shin-Etsu Chemical Co., Ltd.) was added thereto, obtaining a coating treatment solution.

To the coating treatment solution was added 80 g of a phosphor powder which had been prepared as in Example 1 until the crystallization step, filtered, washed, fully deliquored, and dried in air draft for about 1 hour. This was followed by 10 minutes of stirring and 10 minutes of static holding. The precipitate was filtered through a Buchner funnel, fully deliquored, washed with spraying acetone, deliquored, and recovered. A half portion (40 g) was separated, and the remainder was vacuum dried. As a result, 37.6 g of a powder product was obtained.

The particle size distribution of the powder product was analyzed as in Example 1, with the results: D10=10.6 μm, D50=21.1 μm, and D90=31.3 μm.

Example 14

A solution was prepared by diluting 8.10 g of a fluorinated anti-smudge coating (trade name KY108 by Shin-Etsu Chemical Co., Ltd.) with 140 cm³ of butanone.

To the solution was added 40 g of a phosphor powder which had been separated after the coating treatment with 3-aminopropyltriethoxysilane in Example 13. This was followed by 10 minutes of stirring and 10 minutes of static holding. The precipitate was filtered through a Buchner funnel, fully deliquored, washed with spraying acetone, deliquored, recovered, and vacuum dried. As a result, 23.2 g of a powder product was obtained.

The particle size distribution of the powder product was analyzed as in Example 1, with the results: D10=10.8 μm, D50=21.2 μm, and D90=31.0 μm.

Example 15

A solution was prepared by diluting 8.10 g of a fluorinated anti-smudge coating (trade name KY108 by Shin-Etsu Chemical Co., Ltd.) with 140 cm³ of butanone.

To the solution was added 40 g of a phosphor powder which had been prepared as in Example 1 until the crystallization step and recovered by vacuum drying. This was followed by 10 minutes of stirring and 10 minutes of static holding. The precipitate was filtered through a Buchner funnel, fully deliquored, washed with spraying acetone, deliquored, recovered and vacuum dried. As a result, 39.2 g of a powder product was obtained.

The particle size distribution of the powder product was analyzed as in Example 1, with the results: D10=10.9 μm, D50=21.0 μm, and D90=31.2 μm.

Example 16

In 126 g of N,N-dimethylformamide (Wako Pure Chemical Industries, Ltd., for high performance liquid chromatography) was dissolved 14.0 g of powdered polyvinylidene fluoride (trade name Kynar 301F by Arkema Group). A portion (28 g) of the solution was taken out and diluted with 112 g (142 cm³) of acetone to form a treatment solution.

To the solution was added 45 g of a phosphor powder which had been prepared as in Example 1 until the crystallization step and recovered by vacuum drying. This was followed by 10 minutes of stirring. With stirring, 39 cm³ of 50% hydrofluoric acid was added in small divided portions over about 2 minutes. Stirring was continued for a further 10 minutes. The precipitate was filtered through a Buchner funnel, deliquored, washed with spraying a small amount of 50% hydrofluoric acid and then acetone, deliquored, recovered and vacuum dried. As a result, 38.7 g of a powder product was obtained.

The particle size distribution of the powder product was analyzed as in Example 1, with the results: D10=11.3 μm, D50=21.8 μm, and D90=34.2 μm.

Comparative Example 1

In Example 1, the crystallization step was similarly carried out until filtration and deliquoring, but the coating treatment was omitted. The precipitate was washed with acetone, deliquored and vacuum dried, obtaining 183.0 g of a powder product.

The particle size distribution of the powder product was analyzed as in Example 1, with the results: D10=8.8 μm, D50=19.4 μm, and D90=29.6 μm.

Example 17

A solution was prepared by dissolving 37.7 g of germanium oxide ($GeO_2$, 99.99% grade by Rare Metallic Co., Ltd.) in 660 cm³ of 50 wt % hydrofluoric acid while heating and stirring, and allowing the solution to cool down. This solution was mixed with 140 cm³ of 40 wt % hexafluorosilicic acid ($H_2SiF_6$) aqueous solution (Morita Chemical Industries Co., Ltd.) and 2,000 cm³ of 50 wt % hydrofluoric acid. To the mixture was added 13.32 g of $K_2MnF_6$ powder which had been prepared by the method of Example 1. With stirring, the powder was dissolved, obtaining a Mn-containing Si—Ge—F solution.

Separately, 210.5 g of potassium hydrofluoride ($KHF_2$) was mixed with 680 cm³ of 50 wt % hydrofluoric acid solution and 1,270 cm³ of pure water and dissolved therein, obtaining a potassium hydrofluoride solution.

While the Mn-containing Si—Ge—F solution was stirred, the potassium hydrofluoride solution was added in small divided portions, whereupon a pale orange precipitate deposited (Mn-activated complex fluoride of formula (1) wherein A is K, and M is Si and Ge). The precipitate was filtered through a Buchner funnel and deliquored as much as possible. The step until this point is designated crystallization step.

Separately, a coating treatment solution containing n-octylamine was prepared as in Example 1.

The precipitate resulting from the crystallization step was added to the coating treatment solution, followed by 10 minutes of stirring and 10 minutes of static holding. The precipitate was filtered through a Buchner funnel, fully deliquored, washed with spraying acetone, deliquored, recovered and vacuum dried. As a result, 194.7 g of a powder product was obtained.

The particle size distribution of the powder product was analyzed as in Example 1, with the results: D10=10.2 μm, D50=30.5 μm, and D90=50.7 μm.

Comparative Example 2

In Example 17, the crystallization step was similarly carried out until filtration and deliquoring, but the coating treatment was omitted. The precipitate was washed with acetone, deliquored and vacuum dried, obtaining 195.1 g of a powder product.

The particle size distribution of the powder product was analyzed as in Example 1, with the results: D10=10.3 μm, D50=31.0 μm, and D90=51.6 μm.

The phosphors obtained in Examples and Comparative Examples were evaluated for emission characteristics by the following test.

Using a quantum efficiency measuring system (QE1100 by Otsuka Electronics Co., Ltd.), a phosphor just as prepared in powder form was measured for initial internal quantum efficiency relative to excitation light of 450 nm. Also the phosphor powder was placed in an open dish, which was held stationary in a temperature & humidity chamber (Espec Corp.) kept at a temperature of 65° C. and a relative humidity of 90%, for 30 minutes and 7 days as a durability test. The samples were similarly measured for internal quantum efficiency. The results are shown in Table 1. It is noted that for every sample, the fluorescent emission spectrum measured at the same time as the internal quantum efficiency measurement consisted of several sharp peaks in the red region centering at the main peak wavelength of 631 nm, like the samples disclosed in JP-A 2012-224536 (Patent Document 2).

TABLE 1

| | | Durability test | |
|---|---|---|---|
| | Initial | 30 minutes | 7 days |
| Example 1 | 0.897 | 0.822 | 0.844 |
| Example 2 | 0.869 | 0.855 | 0.833 |
| Example 3 | 0.886 | 0.765 | 0.706 |
| Example 4 | 0.904 | 0.753 | 0.759 |
| Example 5 | 0.904 | 0.731 | 0.711 |
| Example 6 | 0.865 | 0.695 | 0.678 |
| Example 7 | 0.838 | 0.580 | 0.585 |
| Example 8 | 0.848 | 0.623 | 0.615 |
| Example 9 | 0.888 | 0.706 | 0.699 |
| Example 10 | 0.884 | 0.786 | 0.772 |
| Example 11 | 0.912 | 0.656 | 0.699 |
| Example 12 | 0.910 | 0.761 | 0.716 |
| Example 13 | 0.875 | 0.749 | 0.815 |
| Example 14 | 0.879 | 0.840 | 0.840 |
| Example 15 | 0.781 | 0.643 | 0.638 |
| Example 16 | 0.855 | 0.699 | 0.563 |
| Comparative Example 1 | 0.862 | 0.581 | 0.435 |
| Example 17 | 0.799 | 0.687 | 0.679 |
| Comparative Example 2 | 0.802 | 0.533 | 0.410 |

As seen from the above results, the surface treatment method of the invention is successful in improving the retention of internal quantum efficiency of red phosphors in a temperature 65° C./RH 90% environment over the untreated sample (Comparative Example 1).

Although the invention is illustrated with reference to specific embodiments, the invention is not limited thereto. Other embodiments, additions, changes and omissions which will occur to those skilled in the art fall within the scope of the invention as long as the effects and benefits of the invention are achievable.

The invention claimed is:

1. A phosphor surface treatment method, comprising treating the surface of a red phosphor with a treating solution comprising a surface treating agent, wherein
said red phosphor is a Mn-activated complex fluoride of formula (1):

$$A_2MF_6:Mn \qquad (1)$$

wherein M is Si, and A is one or more alkali metals selected from the group consisting of Li, Na, K, Rb, and Cs, and contains at least Na and/or K; and
said surface treating agent is selected from the group consisting of:
(A) an organic amine of formula (2):

$$NR^1R^2R^3 \qquad (2)$$

wherein at least one of $R^1$, $R^2$ and $R^3$ is a substituted or unsubstituted monovalent hydrocarbon group, and the remainder is hydrogen, and
(B) a quaternary ammonium salt of formula (2-1):

$$R^4R^5R^6R^7N^+X^- \qquad (2-1)$$

wherein $R^4$, $R^5$, $R^6$ and $R^7$ each are a substituted or unsubstituted monovalent hydrocarbon group, and X is a halogen atom.

2. The phosphor surface treatment method of claim 1, wherein the treating solution is an aqueous solution of the surface treating agent containing hydrofluoric acid or an organic solvent solution of the surface treating agent.

3. The phosphor surface treatment method of claim 1, wherein the treating solution further contains a complex fluoride of formula (3):

$$A_2MF_6 \qquad (3)$$

wherein M is one or more tetravalent elements selected from the group consisting of Si, Ti, Zr, Hf, Ge, and Sn, and A is one or more alkali metals selected from the group consisting of Li, Na, K, Rb, and Cs, and contains at least Na and/or K.

4. The phosphor surface treatment method of claim 1, wherein said red phosphor is a Mn-activated complex fluoride having the formula (1), which is obtained through the steps of:
adding a manganese compound of formula: $Na_2MnF_6$ or $K_2MnF_6$ to at least one of a first solution containing a fluoride of a tetravalent element M wherein M is Si, and a second solution containing a compound selected from the group consisting of a fluoride, hydrogenfluoride, nitrate, sulfate, hydrogensulfate, carbonate, hydrogencarbonate, and hydroxide of an alkali metal A wherein A is one or more metals selected from the group consisting of Li, Na, K, Rb, and Cs, and/or a solid compound of the alkali metal A, and
mixing the first solution with the second solution and/or the solid compound for thereby reacting the fluoride of tetravalent element M, the compound of alkali metal A, and the manganese compound.

5. The phosphor surface treatment method of claim 1, wherein said red phosphor prior to the treating step is in particulate form of particle size distribution having a 50% by volume cumulative particle diameter D50 of at least 2 μm and a 90% by volume cumulative particle diameter D90 of up to 60 μm.

6. The phosphor surface treatment method of claim 1, wherein the treating step includes immersing the red phosphor in the treating solution.

7. The phosphor surface treatment method of claim 1, wherein the treating solution further contains a complex fluoride of formula (3):

$$A_2MF_6 \qquad (3)$$

wherein M is Si, and A is one or more alkali metals selected from the group consisting of Li, Na, K, Rb, and Cs, and contains at least Na and/or K.

* * * * *